United States Patent [19]

Maa

[11] 4,411,734
[45] Oct. 25, 1983

[54] ETCHING OF TANTALUM SILICIDE/DOPED POLYSILICON STRUCTURES

[75] Inventor: Jer-shen Maa, Manville, N.J.

[73] Assignee: RCA Corporation, New York, N.Y.

[21] Appl. No.: 448,279

[22] Filed: Dec. 9, 1982

[51] Int. Cl.³ .................... H01L 21/306; B44C 1/22; C03C 15/00; C23F 1/02
[52] U.S. Cl. ................................ 156/643; 29/571; 29/580; 134/1; 156/646; 156/651; 156/656; 156/657; 156/659.1; 156/662; 204/192 EC; 204/192 E; 252/79.1; 427/85; 427/86; 427/93
[58] Field of Search ............... 156/643, 646, 650–653, 156/656, 657, 659.1, 662, 345, 628; 427/85, 86, 87–89, 91, 93, 95, 38, 39; 204/164, 192 EC, 192 E, 298; 29/571, 580; 252/79.1; 134/1; 357/23, 41, 53, 67; 148/186

[56] References Cited

U.S. PATENT DOCUMENTS

| | | | |
|---|---|---|---|
| 4,141,022 | 2/1979 | Sigg et al. | 357/23 |
| 4,285,761 | 8/1981 | Fatula, Jr. et al. | 156/628 |
| 4,332,839 | 6/1982 | Levinstein et al. | 156/643 X |
| 4,362,597 | 12/1982 | Fraser et al. | 156/643 |

OTHER PUBLICATIONS

*Pure and Applied Chemistry*, vol. 52, pp. 1759–1765 (1980).

Primary Examiner—William A. Powell
Attorney, Agent, or Firm—Birgit E. Morris; R. Hain Swope

[57] ABSTRACT

A method of forming and anisotropically etching a structure on a substrate, said structure being comprised of a layer of doped polycrystalline silicon having thereover a layer of tantalum silicide. The method comprises providing a layer of polycrystalline silicon on the substrate, doping the silicon to render it conductive, preparing the surface of the silicon for deposition of tantalum silicide by treatment with a carbon tetrafluoride/oxygen plasma, depositing tantalum silicide thereon tantalum rich, anisotropically plasma etching the two-layered structure with an etchant mixture of carbon tetrachloride, oxygen and nitrogen, annealing the tantalum silicide layer and, if desired, covering the resultant structure with a protective layer of oxide. In a preferred embodiment, the silicon layer is deposited in the amorphorus state and annealed to the polycrystalline state.

19 Claims, No Drawings

ETCHING OF TANTALUM SILICIDE/DOPED POLYSILICON STRUCTURES

This invention pertains to the preparation and dry etching of two-layer tantalum silicide over doped polysilicon structures useful in electronic devices.

BACKGROUND OF THE INVENTION

Suitable doped polycrystalline silicon structures have been used, for example, as the gate material in insulated gate field effect transistor (IGFET) devices as well as in other similar structures. It is known that improved lateral conductivity can be achieved by replacing doped polycrystalline silicon with a two-layer structure wherein a layer of a refractory metal silicide overlies a layer of doped polycrystalline silicon. See, for example, U.S. Pat. Nos. 4,285,761 and 4,141,022. The two-layer structure is utilized because of its greatly increased speed in comparison with doped polysilicon.

The fabrication of two-layer systems wherein a refractory metal silicide overlies doped polycrystalline silicon has been beset with a number of technical problems. Because of the demand for ever-higher speeds of operation, however, there has been considerable effort in the electronics industry to resolve these problems. In spite of this effort, some serious problems still remain. For example, previous methods of etching such structures are isotropic and will cause undercutting of both layers. In addition, such methods have poor selectivity in that they will continue to etch the layer of silicon dioxide which conventionally underlies such structures. For example, carbon tetrafluoride/oxygen, which has been used to etch such structures, will cause severe undercutting, particularly of the polycrystalline silicon layer when used at high pressures and will etch the underlying oxide when used at low pressures. This mixture is also characterized by poor line-width control, regardless of the operating pressure.

Another problem associated with the subject structures is that, frequently, the refractory metal silicide layer will delaminate from the polycrystalline silicon layer during annealing. In addition, the etching of such structures has been characterized by poor reproducibility, regardless of the etchant mixture utilized.

In accordance with this invention, two-layer structures of doped polycrystalline silicon and refractory metal silicide are anisotropically etched by a highly reproducible method which suffers from none of these disadvantages.

SUMMARY OF THE INVENTION

In accordance with this invention, a layer of polycrystalline silicon is deposited, preferably initially in the amorphous state, on a suitable substrate, conventionally silicon dioxide. The silicon is heavily doped with phosphorus to render it conductive. The doped layer is plasma treated to prepare the surface for deposition of tantalum silicide which is then deposited tantalum rich. The tantalum silicide layer is patterned with a resist and the structure dry etched down to the substrate, i.e. silicon dioxide. The resist is then removed and the tantalum silicide layer annealed.

DETAILED DESCRIPTION OF THE INVENTION

The substrate receiving the two-layer polysilicon/silicide structure in accordance with this invention may be of any material conventionally used in the electronics industry. A preferred substrate is a single crystal silicon wafer. The substrate may be an unprocessed wafer or one that has received part of a multi-layer device or structure. The substrate likewise may be appropriately doped to provide regions of conductivity underlying the subject structure. Conventionally, as is the case with polysilicon gates, there is a layer of gate oxide, i.e. silicon dioxide, immediately under the subject structure. Where a single crystal silicon wafer is utilized, a thin layer of silicon dioxide is initially formed thereover by conventional thermal oxidation.

A thin layer of polycrystalline silicon is then deposited over the oxide layer. Preferably, the layer of polycrystalline silicon is between about 100 and 300 nanometers in thickness. Although the polycrystalline silicon layer may be grown in a conventional manner, it is particularly preferred that it be grown in the amorphous state according to Widmer et al., copending U.S. patent application entitled, "Polysilicon Layers for Semiconductor Devices", Ser. No. 441,371, filed Nov. 12, 1982, the disclosure of which is incorporated herein by reference. As disclosed therein, the film is grown in the amorphous state, preferably by low pressure chemical vapor deposition (LPCVD) from a silicon-containing vapor such as silane, at a temperature of 560°–580° C. Annealing converts the film to the polycrystalline state. As demonstrated in the Widmer et al. application, silicon films grown in the amorphous state and annealed to the polycrystalline state are clearly superior to films grown in the polycrystalline state, i.e. by LPCVD at a temperature of 620° and above, for device applications. The amorphous-formed films are superior in terms of their microhomogeneity, lack of strain and, most important, their exceptional smoothness.

The layer of silicon is then heavily doped with phosphorus, as by conventional diffusion techniques, to render it conductive. Generally, the silicon is heated in a conventional furnace to a temperature of from about 850° to 950° C., preferably about 900° C., for from 5 to 15 minutes under an inert atmosphere such as nitrogen. This initial heating anneals the silicon and, if deposited in the amorphous state, converts it to the polycrystalline state. A suitable source of phosphorus is then pumped into the furnace. Suitable sources include elemental red phosphorus, phosphorus pentoxide, phosphorus trichloride and, preferably, phosphorus oxychloride. The temperatures to be utilized with each of these materials may vary somewhat to achieve optimum conditions. The structure is held in the furnace from from 5 to 30 minutes, preferably about 25 minutes, after which it is removed and allowed to cool to ambient temperature. In the furnace, a glassy phosphosilicate layer is formed on the surface of the silicon from which diffusion proceeds into the silicon.

The phosphosilicate glass is removed from the surface of the polycrystalline silicon prior to deposition of the tantalum silicide layer. This is done by conventional techniques such as by treatment with an aqueous solution containing by volume, 5 percent of buffered hydrofluoric acid and 3 percent of nitric acid. In accordance with this invention, however, the surface of the polycrystalline silicon layer is plasma treated with a mixture of carbon tetrafluoride and oxygen, preferably in the proportion 97:3 by volume.

The plasma treatment is carried out for from one to three minutes in a conventional apparatus such as that described by Vossen in an article entitled "Plasma Deposition and Etching Reactors for Semiconductor Applications", in *Pure and Applied Chemistry*, Vol. 52, pp. 1759–1765 (1980). In a parallel plate reactor such as described therein, a pressure of 35 mtorr and 300 watts power to the bottom electrode are utilized. The plasma treatment removes any native oxide which forms on the surface of the silicon and slightly damages the surface itself in preparation for deposition of the silicide layer. This latter effect virtually eliminates the problem of delamination of the silicide layer during annealing.

A layer of tantalum silicide is then deposited over the polycrystalline silicon. Although other art-recognized metals such as tungsten, titanium, niobium or molybdenum could be utilized, tantalum is preferred in this invention. Although any suitable technique could be utilized to deposit the layer of tantalum silicide, magnetron sputtering utilizing three targets is preferred. Conventionally, such films are deposited tantalum deficient. U.S. Pat. No. 4,285,761, for example, recommends that the film be deposited with two silicon atoms for each atom of refractory metal, e.g. tantalum. It has been found in accordance with this invention, however, that a superior structure is produced by putting the silicide down tantalum rich, etching it and thereafter annealing it. The order of etching followed by annealing is also a departure from conventional practices and is responsible for the significantly improved reproducibility of etch obtained by the subject process.

Two phosphorus-doped silicon targets and one tantalum target are used in the magnetron sputtering of tantalum silicide according to this invention. The film is preferably deposited in a molar ratio of one part tantalum to from about 1.5 to about 1.9, preferably about 1.6, parts silicon. The film is deposited in the amorphous state to a thickness of 200 to 300 nanometers.

The tantalum silicide layer is then patterned with a photoresist suitable for dry etching techniques. A preferred material is a positive photoresist available from Hunt Chemical Company under the trademark HPR-204. The two-layer structure is then plasma etched utilizing an etchant mixture of carbon tetrachloride, oxygen and nitrogen. The presence of the oxygen reduces the tendency to form polymers under conditions of glow discharge and increases the etch rate of both the tantalum silicide and the polycrystalline silicon. The oxygen content of the etchant mixture must be sufficient to cause the tantalum silicide and the polycrystalline silicon to etch at about the same rate while not being so high as to retard the etching of both layers. In this way, an anisotropic dry etch of the two-layer structure is achieved.

In accordance with this invention, the etchant mixture for the two-layer tantalum silicide/silicon structure contains, on a volume basis, from about 30 to about 80 percent of carbon tetrachloride, from about 1 to about 6 percent of oxygen and from about 20 to about 50 percent of nitrogen. A preferred mixture comprises about 59 percent of carbon tetrachloride, about 2.5 percent of oxygen and about 38.5 percent of nitrogen. The above mixtures are applied in a conventional apparatus such as a planar reactor described in the above-mentioned Vossen article. In such reactors, the upper electrode can be powered to between 50 and 200 watts and the lower electrode tuned to about −150 volts with respect to ground. The total gas pressure utilized is typically 20 to 65 mtorr and the total gas flow 30 to 100 sccm. None of these parameters is particularly critical.

If the surface of the polycrystalline silicon is rough, i.e. if it is deposited in the polycrystalline state, it tends to leave fine particles of silicon on the underlying oxide surface. These can be removed by plasma etching utilizing a mixture of carbon tetrafluoride and oxygen in a ratio of from about 90:10 to about 99:1 by volume, preferably about 97:3 by volume. It has been found, however, that depositing the silicon in the amorphous state substantially eliminates the requirement for this step. In any event, the surface can be inspected readily with an optical microscope to determine whether it is required.

The photoresist is then removed in an oxygen plasma and the structure is annealed by heating to a temperature of from about 800° to about 950°, preferably about 900° C., in an argon furnace for about 30 minutes. Annealing forms tantalum silicide, i.e. $TaSi_2$, by reacting with the underlying silicon layer. The tantalum silicide layer is very conductive. The tantalum silicide layer is then preferably protected with a thin layer of silicon oxide grown by either steam or dry oxidation.

It has been found in accordance with this invention that, during annealing of the subject structures, phosphorus diffuses from the polycrystalline silicon layer. This increases the resistivity of the layer, decreases the etch rate and markedly adversely affects the reproducibility of the etch. Hence, reversing the order of these procedures as I have done produces a significant improvement in reproducibility.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A series of (100) single crystal silicon wafers were utilized as substrates. The wafers were heated to 900° in steam for 50 minutes to form a layer of silicon dioxide 200 nanometers thick on the surface.

The wafers were placed in a LPCVD reactor in a quartz tube which was heated to 580°. Deposition of amorphous silicon was carried out at 350 mtorr pressure, 200 cm$^3$/min silane flow. Deposition was continued for 40 minutes resulting in a layer of silicon 200 nanometers thick which was confirmed to be amorphous by x-ray diffraction.

The wafers were then transferred to a diffusion furnace and heated under a nitrogen atmosphere to a temperature of 950° for 5 minutes, thus annealing the silicon and converting it to the polycrystalline state. Phosphorus oxychloride was then flowed into the furnace and heating was continued for an additional 5 minutes. The wafers were withdrawn and allowed to return to ambient temperature over about 5 minutes.

The native oxide which formed on the surface of the polycrystalline silicon was removed by dipping the wafers into an aqueous solution containing 5 percent by volume of buffered hydrofluoric acid and 3 percent by volume of nitric acid for one minute. The wafers were then rinsed and spin-dried in dry nitrogen.

The wafers were placed into a parallel electrode etching reactor. The upper electrode was grounded and the lower (substrate) electrode was powered to produce a voltage of 300 volts. The wafer electrode power was 300 watts and the pressure was 35 mtorr. The surface of the polycrystalline silicon was treated for 1 minute utilizing an etchant mixture of 97 sccm carbon tetrafluoride and 3 sccm oxygen.

The wafers were immediately placed into a conventional magnetron sputtering apparatus. Utilizing two phosphorus-doped silicon targets and one tantalum target, a layer of tantalum silicide 200 nanometers thick was deposited onto the polycrystalline silicon in an atmosphere of argon. The total pressure in the apparatus was 3 mtorr. The power applied to each of the three was adjusted in such a way that the layer deposited was tantalum rich, i.e. the layer was $TaSi_{1.6}$ instead of the stoichiometric porportion, i.e. $TaSi_2$. The layer was found to be amorphous by x-ray diffraction.

A layer of positive photoresist, HPR-204, Hunt Chemical Company, was spun onto the tantalum silicide layer to a thickness of about 600 nanometers. The photoresist was irradiated through a suitable mask with light at 435 nm. The resist was then baked at 135° for 30 minutes.

The wafers were then returned to the parallel plate reactor and etched with an etching mixture of 23 sccm carbon tetrachloride, 1 sccm oxygen and 15 sccm nitrogen for 15 minutes at 40 mtorr pressure. The upper electrode was powered at 100 watts and the lower electrode tuned to produce a voltage for ground of −150 volts. The structure was anisotropically etched to the oxide surface. This etchant mixture is particularly advantageous because it anisotropically etches the tantalum silicide and the polycrystalline silicon, but not the underlying oxide. The surface was examined microscopically and found not to be in need of further treatment. The wafers were placed in a conventional barrel reactor and the photoresist removed in an oxygen plasma.

The wafers were then placed in a conventional furnace and annealed in an argon atmosphere at 900° for 30 minutes. A second layer of oxide was then grown on the surface as above for further device fabrication.

EXAMPLE 2

Wafers were prepared as in Example 1 with the exception that the silicon layer was deposited at 620°. This layer was confirmed to be polycrystalline by x-ray analysis. Microscopic examination after the dry etching step showed the surface of the wafer to contain residual particles of silicon. These were removed by returning the wafers to the reactor and etching for 4 minutes with an etchant mixture of 97 sccm carbon tetrafluoride and 3 sccm oxygen at a pressure of 85 mtorr.

An anisotropic etch comparable to that obtained in Example 1 was achieved.

What is claimed is:

1. A method of forming a patterned structure on a substrate comprised of a layer of doped polycrystalline silicon having thereover a layer of tantalum silicide, said method comprising:
   (a) providing a layer of polycrystalline silicon on the substrate;
   (b) doping the silicon layer to render it conductive;
   (c) plasma treating the surface of the silicon layer with a mixture of carbon tetrafluoride and oxygen to prepare the surface for deposition of tantalum silicide;
   (d) depositing a layer of tantalum silicide onto the silicon layer;
   (e) anisotropically plasma etching the tantalum silicide layer and the silicon layer with an etchant mixture of carbon tetrachloride, oxygen and nitrogen; and
   (f) heating the resulting structure to a temperature sufficient to anneal the tantalum silicide layer.

2. A method in accordance with claim 1, wherein the silicon layer is deposited in the amorphous state by low pressure chemical vapor deposition from a source of silicon at a temperature of from about 560° to 580° C. and annealed to convert it to the polycrystalline state.

3. A method in accordance with claim 2, wherein the source of silicon is silane.

4. A method in accordance with claim 1, wherein the silicon layer is deposited in the polycrystalline state by low pressure chemical vapor deposition from a source of silicon at a temperature of about 620° C., said method additionally including the step of treating the surface of the substrate after said plasma etching step to remove residual particles of silicon by plasma etching with an etchant composition comprising carbon tetrafluoride and oxygen.

5. A method in accordance with claim 4, wherein the source of silicon is silane.

6. A method in accordance with claim 4, wherein said particles are removed utilizing an etchant mixture comprising tetrafluoride and oxygen in a ratio of from about 90:10 to about 99:1by volume.

7. A method in accordance with claim 6, wherein said mixture comprises carbon tetrafluoride and oxygen in a ratio of about 97:3 by volume.

8. A method in accordance with claim 1, wherein siad silicon layer is doped with phosphorus.

9. A method in accordance with claim 8, wherein the silicon layer is doped by diffusion of a source of phosphorus at a temperature of from about 850° to about 950° C.

10. A method in accordance with claim 9, wherein the source of phosphorus is phorphorus oxychloride.

11. A method in accordance with claim 1, wherein the mixture in step (c) is comprised of carbon tetrafluoride and oxygen in the proportion 97:3 by volume.

12. A method in accordance with claim 1, wherein the layer of tantalum silicide is deposited by magnetron sputtering.

13. A method in accordance with claim 12, wherein the layer of tantalum silicide is deposited in a molar ratio of one part tantalum to from about 1.5 to about 1.9 parts silicon.

14. A method in accordance with claim 13, wherein the layer of tantalum silicide is deposited in a molar ratio of one part tantalum to about 1.6 parts silicon.

15. A method in accordance with claim 1, wherein the etchant mixture in step (e) comprises, on a volume basis, from about 30 to about 80 percent of carbon tetrachloride, from about 1 to about 6 percent of oxygen and from about 20 to about 50 percent of nitrogen.

16. A method in accordance with claim 15, wherein the etchant mixture in step (e) comprises, on a volume basis, about 59 percent of carbon tetrachloride, about 2.5 percent of oxygen and about 38.5 percent of nitrogen.

17. A method in accordance with claim 1, wherein the tantalum silicide layer is annealed in an argon atmosphere at a temperature of from about 800° to about 950° C.

18. A method in accordance with claim 17, wherein the tantalum silicide layer is annealed at a temperature of about 900° C.

19. A method in accordance with claim 1 additionally including the step of forming a layer of silicon dioxide over the structure after the tantalum silicide layer has been annealed.

* * * * *